(12) United States Patent
Gieβibl (10) Patent No.: US 9,683,906 B2
(45) Date of Patent: Jun. 20, 2017

(54) REDUNDANT TORQUE SENSOR—MULTIPLE BAND ARRAYS

(71) Applicant: Methode Electronics Malta Ltd., Qormi, Birkirkara (MT)

(72) Inventor: Johannes Gieβibl, Amerang (DE)

(73) Assignee: METHODE ELECTRONICS MALTA LTD., Qormi, Birikirkara (MT)

( * ) Notice: Subject to any disclaimer, the term of this patent is extended or adjusted under 35 U.S.C. 154(b) by 0 days.

(21) Appl. No.: 15/045,767

(22) Filed: Feb. 17, 2016

(65) Prior Publication Data

US 2016/0238472 A1   Aug. 18, 2016

(30) Foreign Application Priority Data

Feb. 18, 2015  (DE) .................. 10 2015 102 337
Feb. 18, 2015  (DE) .................. 20 2015 105 090 U (51) Int. Cl.
| | |
|---|---|
| *G01L 3/00* | (2006.01) |
| *G01L 3/10* | (2006.01) |
| *G01D 5/20* | (2006.01) |
| *G01D 5/12* | (2006.01) |

(52) U.S. Cl.
CPC ............ *G01L 3/104* (2013.01); *G01D 5/2013* (2013.01); *G01D 5/12* (2013.01)

(58) Field of Classification Search
CPC ......... G01D 5/2013; G01D 5/12; G01L 3/104
USPC ..................... 73/862.331–862.335
See application file for complete search history.

(56) References Cited

U.S. PATENT DOCUMENTS

| | | | |
|---|---|---|---|
| 4,803,885 A * | 2/1989 | Nonomura ............ | G01L 3/102 73/862.333 |
| 4,989,460 A * | 2/1991 | Mizuno ................. | G01L 3/105 73/862.335 |
| 5,216,308 A * | 6/1993 | Meeks ................ | F16C 32/0459 310/90.5 |
| 5,391,403 A | 2/1995 | Kawado et al. | |
| 7,363,827 B2 | 4/2008 | Hedayat et al. | |

(Continued)

FOREIGN PATENT DOCUMENTS

| | | |
|---|---|---|
| DE | 10306029 A1 | 2/2004 |
| DE | 102006054664 A1 | 5/2008 |

(Continued)

*Primary Examiner* — Max Noori
(74) *Attorney, Agent, or Firm* — Thompson Coburn LLP; Matthew Himich (57) ABSTRACT

A device for determining an external magnetic influence has a component comprising ferromagnetic material and a magnetizable region comprising at least three opposing magnetic tracks. The at least three magnetic opposing magnetic tracks are magnetizable in opposite directions, form at least two groups, and are arranged axially relative to the component. A first magnetic field sensor for emitting a signal is arranged radially to the component and assigned to the first group. A second magnetic field sensor for emitting a signal is arranged radially to the component and assigned to the second group. Redundant magnetic field sensors, each configured for emitting a signal, may be arranged radially in relation to the component for each of the first and second groups. The signals of the first and the second sensors can be set in relation to each other and in relation to the signals of the redundant first and second sensors.

10 Claims, 6 Drawing Sheets

(56) References Cited

U.S. PATENT DOCUMENTS

| | | | | |
|---|---|---|---|---|
| 8,757,014 B2* | 6/2014 | Dinter | ............... | F16H 57/01 |
| | | | | 73/862.08 |
| 2004/0016305 A1* | 1/2004 | Matsumoto | ............ | G01L 5/221 |
| | | | | 73/862.331 |
| 2006/0179959 A1* | 8/2006 | Ouyang | ................ | G01L 3/102 |
| | | | | 73/862.331 |

FOREIGN PATENT DOCUMENTS

| | | | |
|---|---|---|---|
| EP | 0523025 | A1 | 1/1993 |
| EP | 0525551 | A2 | 2/1993 |

\* cited by examiner

REDUNDANT TORQUE SENSOR—MULTIPLE BAND ARRAYS

RELATED APPLICATION DATA

This application claims the benefit of German Patent Application No. 10 2015 102 337.7, filed on Feb. 18, 2015, and German Utility Model No. 20 2015 105 090.9, filed on Feb. 18, 2015, the disclosures of which are incorporated by reference herein.

DESCRIPTION

The invention relates to a device for determining a magnetic influence due to an error, an interfering effect or other influences of a product, comprising a component which consists at least partially of ferromagnetic material, in particular a device which comprises two sensors for determining external magnetic influences.

A device for measuring forces or torques is already disclosed in DE 277 521 A1. Accordingly, a measuring device is described which carries out non-contact measurement of forces or torques on fixed or rotating deformation elements based on the magnetoelastic effect. The deformation elements of the device comprise the deformation element itself, at least two zones consisting of thin amorphous metal layers applied to the surface of the element as well as sensor coils assigned to said zones. The measuring device measures surface tensions as a result of forces or torques applied to bending beams, load measuring pins, torsional waves etc.

A sensor coil is assigned to each surface zone of the deformation element, with the sensor coil either surrounding the deformation element in the region of the coated surface zone or being arranged in the form of an air-core coil or at as close a distance as possible from the surface zone.

Furthermore, DE 10 2005 002 966 A1 discloses a device for determining the performance of equipment which provides the use of additional redundant sensors for measuring the torque existing on a shaft part.

In addition, EP 2 793 009 A1 describes an elongated shaft having magnetically active fields which are radially magnetised in the opposite direction. Magnetoelastic sensors are assigned to these magnetised fields. The shaft including the magnetoelastic fields thereof is subjected to a tensile and/or compressive stress.

U.S. Pat. No. 8,578,794 A1 discloses a torque sensor having an elongated body and magnetoelastically active fields which are directly or indirectly connected to the body or which form a part of the body. A torque applied to the body is proportionally transmitted to the active field including at least one magnetically polarised field. Signals of the magnetic field sensor are processed in such a way that effects of a magnetic near field are compensated.

Furthermore, EP 2 799 827 A1 discloses a magnetoelastic torque sensor with an at least sectionally hollow elongated body and a magnetoelastically active field acting on the inner surface of the body. The torque sensor comprises a plurality of magnetic field sensors which are arranged inside the sectionally hollow body.

U.S. Pat. No. 6,553,847 B2 discloses a torque sensor, in particular a non-contacting magnetoelastic torque sensor for providing a measure of the torque applied to a shaft.

A torque sensor has a magnetoelastically active region on a shaft subjected to a torque and a magnetic field sensor. The magnetic field sensor is mounted in proximity to the magnetoelastic region and oriented in relation thereto in order to sense the value of the magnetic field on the sensor device and provide the output signal in response thereto.

US 2012/0074933 A1 discloses a method and an apparatus for cancelling a field noise in a torque sensor. For this purpose, three sets of magnetic field sensors and associated coils are placed on a shaft. The first set is placed in a central region of the shaft. The second and third set of field sensors are placed on the right side and the left side of the field sensor of the central region, respectively. All coils are connected to each other and jointly output a sensor signal. According to this prior art, however, only the final result can be identified. There is no possibility of obtaining differentiated findings in respect of the underlying parameters such as torque, voltage etc. It is not possible to determine what is actually happening.

Devices which are capable of determining magnetic influences due to errors, interfering effects or other influences of a product on magnetic tracks of a magnetised region combined into groups and by means of mathematical evaluation of signals of said magnetic tracks combined into groups have so far not been known from the prior art.

Based on this prior art, the disadvantages and deficiencies thereof and in seeking to meet industrial target requirements of, for example, automotive and/or aerospace technology, it is the object of the present invention to provide sensors which are capable of detecting, in particular, external magnetic fields of, for example, products to be tested.

It is particularly desirable that, apart from the product-related magnetic fields, magnetic fields which are not product-related and which are, for instance, caused by environmental influences, e.g. by power lines or power rails, can be detected as such. Such additional influencing variables may be of importance especially in cases where, due to production tolerances, sensors detect such additional influences, which as such are not desired in the detection. Therefore, the particular objective is to be able to distinguish between the sources of the occurring magnetic fields.

Furthermore, it is the object of the invention to provide a device which allows for the possibility of detecting external magnetic influences on the device and, as a result, deviant signal behaviour as well as determining external influences on the magnetisation.

It is therefore a further object to detect with the detection of external magnetic influences by the device whether products related to the device are in turn exposed to influences, for example malfunctions.

The determination of such signal deviations shall enable compliance with safety standards in the field of automotive and/or aerospace technology.

The device shall allow for the measurement of magnetic influences, for example punctiform external fields. "Punctiform" is understood to mean any kind of magnetic field differing from the earth's magnetic field. The punctiform magnetic field is located, in particular, in close proximity of a sensor.

It is furthermore desirable that such a device works precisely and in a maintenance-free manner. The device should be easy to apply. It should be inexpensive and easy to produce.

The device is part of a magnetoelastic torque sensor which comprises, in particular, magnetic field sensors with associated coils, a coil holder and evaluation electronics.

Thus, the device according to the invention comprises a component.

Typically, the component consists of an at least partially ferromagnetic, magnetoelastically suitable material.

According to the invention, the component signifies a preferably elongated body, for example a cylindrical body, a conically tapering body or a wave-shaped body. The component may also have a staircase-shaped configuration.

In any case, the body may at least partially be provided with or made of a ferromagnetic material. Hardening steel containing nickel (Ni) or chrome (Cr) is particularly suitable as such a ferromagnetic material. However, it shall be understood that other ferromagnetic materials may likewise be used.

The component may preferably be configured in the form of a shaft, in particular a drive shaft.

Preferably, the component is arranged in an aircraft, a land craft or a watercraft. However, the component can, for example, also be used in an industrial facility or a household appliance.

The component has a magnetisable region.

According to the invention, in the case that the magnetisation occurred, the component has a region which comprises at least three magnetic tracks opposing each other, which, for the sake of simplification, are also referred to below by way of example as "tri-band magnetisation". Two groups each consisting of two magnetic tracks opposing each other are applied within said region.

The arrangement of three magnetic tracks opposing to each other represents an advantageous combination of two dual-band magnetic tracks. The combination of the two dual-band magnetic tracks is achieved by mirroring the dual-band array and by jointly using the middle track. This has the effect that the respectively inner track has the same positive or negative polarisation.

This has the advantage that one magnetic track can be omitted and thus a spatial combination of the magnetic tracks can be provided so that a more uniform mapping of measurement results can be achieved in this way and less axial installation space is required.

The component has at least three circumferential magnetic tracks (tri-band) with magnitisations opposing each other.

In case of a tri-band magnetisation, the magnetic track which is spatially arranged on the left is, for example, magnetised positively, the middle magnetic track negatively and the right magnetic track positively again, and vice versa.

The number of magnetic tracks with a magnetisation opposing the adjacent magnetic track may, however, also be increased.

The magnetisation of the individual magnetic tracks may take place simultaneously or in a time-delayed manner.

The difference resulting from the opposing magnetisation of the magnetic tracks is based on the magnetoelastic effect caused by stress in the component and is expressed by a magnetic field change, the axial ratio of which is measured by the magnetic field sensor. In this context, the occurrence of stress is well known in the prior art and therefore not be explained below.

Preferably, at least one coil of a first magnetic field sensor for emitting a signal arranged radially in relation to the component is assignable to the first outer and middle magnetic track, respectively. For the sake of simplification, the first outer magnetic track is also referred to below as "first magnetic track". Preferably, at least one coil of a second magnetic field sensor for emitting a signal arranged radially in relation to the component is assignable to the middle and third magnetic track, respectively. In case of the tri-band magnetisation described above, said third magnetic track is also referred to as "second outer magnetic track".

The information resulting from the evaluation of the first outer and middle magnetic track, which may be a track-related partial signal, can be set in relation to each other. Likewise, the information resulting from the evaluation of the middle and third magnetic track, which may be a track-related partial signal, can also be set in relation to each other.

Based on these two pieces of track-related information, the first sensor evaluates a signal. Likewise, the second sensor evaluates such a signal based on the two pieces of track-related information.

The signal of the first sensor can be set in relation to the signal of the second sensor.

The arrangement of two groups of at least two magnetic tracks discussed below serves the purpose of evaluating in a better and more differentiated way an actual state or possible deviations of the product to be tested, for example due to interferences and errors, because in this way at least two comparative values are obtained, which can be derived from the respective voltage of the first group of at least two magnetic tracks and the voltage of the second group of at least two magnetic tracks.

Furthermore, the spatially dense arrangement of the magnetic tracks, which will be discussed below, allows for the external magnetic field differences between the positions of the magnetic track channels to be as small as possible.

The first outer and middle magnetic tracks are also referred to below as "first group"; the middle and third, i.e. second outer, magnetic tracks are referred to as "second group".

According to the invention, the at least three magnetic tracks opposing each other are combined into at least two groups of at least two magnetic tracks axially in relation to the component. Thus, the two groups share at least one magnetic track, which is normally the middle magnetic track in case of three magnetic tracks opposing each other, the adjacent ones of which are each magnetised in opposite directions.

Preferably, at least one coil which measures the axial ratio of the magnetic field caused by the magnetoelastic effect is assigned to each of the at least two magnetic tracks of the first group.

Preferably, at least one coil of a magnetic field sensor arranged radially in relation to the component is assigned to each of the at least two magnetic fields of the second group, with the magnetic field sensor being spaced apart from the sensor of the first group in the circumferential direction of the component casing.

Insofar as the term "coil" is used within the scope of the invention, it preferably also refers to a wire winding with an amorphous core, which is used as a measuring coil. Preferably, the coils are arranged axially (parallel) in relation to the component in order to obtain a measurement value which is largely uninfluenced by other kinds of stresses, in particular tensile and compressive stresses.

In case of a tri-band magnetisation, it is preferred that a sensor has at least two coils.

The coils of the respective sensor are connected to evaluation electronics which may be accommodated in a separate component.

The magnetic field sensor is a highly sensitive measuring device for detecting extremely small magnetic fields.

The first coil of each sensor is arranged in such a way that it detects a change in the magnetic field of a magnetic track in a first direction on the surface of the component.

The second coil of each sensor is arranged in such a way that it detects a change in the magnetic field of a magnetic track in a second opposite direction on the surface of the component. The evaluation electronics of the sensor emits a signal.

In an arrangement of three magnetic tracks, the second coil of the first sensor and the first coil of the second sensor thus detect the middle magnetic track.

The signal of the sensor of the first group consisting of at least two magnetic tracks is evaluated and transmitted as a first group signal. The first group signal results from a first difference evaluation of the information gained from the two opposing magnetic tracks. For example, the group signal may be a measurable variable in volts or millivolts but also any other measurable variable.

The signal of the sensor of the second group consisting of at least two magnetic tracks is likewise evaluated and transmitted as a second group signal. The second group signal also results from a first difference evaluation of the information gained from the two opposing magnetic tracks. For example, the second group signal may be a measurable variable in volts or millivolts but also any other measurable variable.

The output signals of the respective sensors oppose each other due to the fact that the one group measures a negative polarisation and the other group a positive polarisation.

Insofar as two sensors and two group signals are mentioned above, the functional principle of the invention will be described first of all based on the explanation of the processes around the first sensor in order to elucidate the underlying physical conditions.

In the physical sense, the sensor is displaced by one magnetic track in order to measure a reverse reaction in the form of an opposite signal value. Last but not least, according to the invention, such a "displacement" inter alia serves the purpose of determining that there is an external magnetic influence, thus another than the magnetoelastic magnetic field.

Said reverse reaction is such that, due to the aforementioned "displacement" by one magnetic track, the sensor detects a reversal of magnetisation of the magnetic tracks according to the above-described succession of magnetisation from positive to negative or from negative to positive, depending on the arrangement of magnetisation of the magnetic tracks.

In case of such a "displacement" of the sensor by one magnetic track in the physical sense, this sensor has the function of redundant sensor measuring in a differential manner.

Redundancy in this respect is the provision of a dual detection and evaluation system having a compensation function in case of loss of sensor information.

While redundancy in the conventional sense means that two sensors take measurements in the same direction due to the same arrangement of the magnetic tracks, redundancy in the present case means that the two sensors also take measurements in the opposite direction as a result of the functional combination of two dual-band systems according to the above introduction. In this case, the information from, for example, the first outer and middle and the middle and third, thus the second outer magnetic track is provided, and vice versa. A further second difference can be calculated from this information. Due to the tri-band configuration, a further magnetic track can be omitted.

From a constructional point of view, the aforementioned "displacement" of the sensor by one magnetic track is achieved by disposing a second sensor with associated coils, which is axially displaced by one magnetic track in relation to the first sensor.

In case of a tri-band magnetisation of such a configuration, both sensors detect the middle magnetic track of the tri-band magnetisation in an overlapping manner.

Since it is not possible to constructively arrange the coil of the second sensor relating to the overlapped magnetic track at the same position as the corresponding coil of the first sensor, it is arranged in an offset manner in relation to the circumferential surface of the component casing in a rotatory manner.

The magnetisation of this region of the component is influenced if, for example, a torque is applied to the component.

In this exemplary case, the first sensor takes a measurement in one direction due to the magnetisation of the magnetic tracks (of the first group in relation to each other). In such a case where a positive (clockwise) torque is applied, the emitting signal receives an increased value.

When a measurement is taken by the second sensor, the value of magnetisation also increases in this exemplary case where a positive (clockwise) torque is applied. Since, however, the polarisation of the magnetic tracks is reverse, the signal value decreases.

Depending on the positive or negative direction of the magnetic tracks of the first group of a tri-band magnetisation, in which the first track is, for example, positive and the middle track negative, and depending on the torque applied, when shown in a mathematical coordinate system in which the torque is indicated in Nm on the x-axis and in which the voltage is indicated in V on the y-axis, the linear graph would thus result in increasing voltage values in case of a positively increasing torque, whereas the reverse direction of magnetisation of the magnetic tracks of the second group, in which the middle track is negative and the third track positive, would result in decreasing voltage values in case of a positively increasing torque.

As already mentioned, the signal of the first sensor can be set in relation to the signal of the second sensor. In this case, this results in a second difference.

According to the invention, it is irrelevant when the aforementioned setting in relation to each other takes place. Depending on the application, this may, in particular, be carried out by the user of the device and/or the process at a later time.

This difference may, in particular, result due to the opposing magnetisation of the two magnetic tracks of each group.

By separately reading out the magnetic tracks, it is also possible to detect these above-described external magnetic fields based, for example, on environmental influences and to distinguish them from the product-related magnetic fields.

A difference can be determined from the group signals of the first and/or second sensors of at least two adjacent groups. Preferably, the object is to determine a difference value from both signal values.

As mentioned above, the difference quantifies the voltage difference between the first group of the at least two magnetic tracks in relation to the second group consisting of at least two magnetic tracks.

The differences of the two first sensors determined in this way are set in relation to each other. Thus, the second difference between the first sensors is indicated.

In the event that interferences, external or other influences or errors affect the product to be tested, this may result in a difference between the two first sensors.

The existence of above-described difference is thus a first basis for determining an external magnetic influence on the component.

Due to the invention, it is possible to detect at least three states of the component and, as a result, of the product to be tested.

First of all, the invention allows for the determination of the object to be tested. Normal state of the present invention is understood to mean any initial state, be it a predetermined and/or predefined state, in particular a state that is not caused by interfering effects or other influences which may have occurred in connection with the respective third-party product.

According to the invention, the normal state may, for example, be determined as follows: the signal value resulting from the first group of at least two magnetic tracks, for example a voltage value X, and the signal value resulting from the second group of at least two magnetic tracks, which is, for example, also a voltage value Y, are added first and then divided by the number of groups, e.g. a factor of two.

In addition to the aforementioned normal state, the device according to the invention is also capable of detecting deviating states of the component and thus indirectly of the product to be tested. These deviating states can in turn be subdivided into states which are still within a predefined and/or predetermined tolerance limit and states which are outside such a tolerance limit.

In particular, the tolerance limits can also be determined by the user of the device at a later time.

This situation occurs especially in case of external magnetic influences. As described below by way of example, upon occurrence of external magnetic influences, the above-described overall behaviour of the device changes.

External magnetic influences may, for example, be caused by interfering effects or other influences of the product to be tested. Typically, such external magnetic influences exert an influence on the magnetic sensors of the component and falsify the result of measurement.

While in the previously described normal state the sensor measures plus or minus with respect to the magnetic tracks, this is different in the event of an external magnetic influence.

In the event of an external magnetic influence, substantially the same reaction takes place on both sensors. The value resulting from the signal changes in a parallel manner according to the magnetic influence. Basically, a parallel shift of the linear graphs in the mathematical coordinate system takes place.

If the external magnetic influence is such that it is the result of an interfering effect or a damage of the product to be tested, the value resulting from this signal continues to change substantially in a parallel manner but with different distances from the signal value of the normal state in relation to each other.

The torque with its signals runs, however, in a differential manner.

First of all, the invention can determine a state deviating from the normal state within tolerance limits.

Finally, it is possible to determine errors, interfering effects or other influences of a product which are outside predefined tolerance limits.

According to the invention, such a state which deviates from the normal state and which is still within predetermined tolerance limits can, for example, be determined as follows: the signal value resulting from the first group of at least two magnetic tracks, for example a voltage value X, and the signal value resulting from the second group of at least two magnetic tracks, which is, for example, also a voltage value Y, are both changed with an identical external magnetic field influence Z; the X value and the Y value, which are each increased by the Z value, are added and then divided by the number of groups, e.g. by a factor of two.

The value resulting therefrom is increased by the value Z representing the external influence on the component.

According to the invention, a state which is outside predetermined tolerance limits, such as an interference state, can, for example, be determined as follows: the signal value resulting from the first group of at least two magnetic tracks, for example a voltage value X, and the signal value resulting from the second group of at least two magnetic tracks, which is, for example, also a voltage value Y, are both changed with a non-identical interference value S, or only one group is loaded with an interference value S; the X value and the Y value, which are each increased by the S value, are added and then divided by the number of groups, e.g. by a factor of two. The value resulting therefrom is increased by another value than the interference value S.

This result demonstrates that a non-homogeneous external influence on the product to be tested has occurred, with the result that a reliable determination of the torque is no longer possible.

Hence, there is the need to transfer the system to a secured mode.

EXAMPLE

The aforementioned explanation of the determination of the normal state, a state within the tolerance range and a state outside the tolerance range will be illustrated below by way of a numerical example:

According to the invention, the normal state can, for example, be determined as follows: the signal value of 3.0 V resulting from the first group of at least two magnetic tracks and the signal value of 2.0 V resulting from the second group of at least two magnetic tracks are added and then divided by a factor of group numbers of two so that, in the normal state, a result of 2.5 V is achieved, which corresponds to the offset of the two groups at 0 Nm.

According to the invention, a state which is still within predetermined tolerance limits can, for example, be determined as follows: the signal value of 3.0 V resulting from the first group of at least two magnetic tracks and the signal value of 2.0 V resulting from the second group of at least two magnetic tracks are both changed with the identical external influence 0.2 V; the signal value of 3.2 V resulting therefrom and the signal value of 2.2 V resulting therefrom are added and then divided by the factor of group numbers of two. The value resulting therefrom is 2.7 V and thus reflects the increase by the identical external influence of 0.2 V on the offset at 0 Nm of 2.5 V for both groups.

According to the invention, an interference state which is outside predetermined tolerance limits can, for example, be determined as follows: the signal value of 3.0 V resulting from the first group of at least two magnetic tracks and the signal value of 2.0 V resulting from the second group of at least two magnetic tracks are compared with each other. Only the first group is changed with the interference value 0.2 V; the signal value of 3.2 V resulting therefrom and the unchanged signal value of 2.0 V are added and then divided by the factor of group numbers of two. The value of 2.6 V resulting therefrom documents a non-homogeneous external influence on the product to be tested as compared to the normal state, with the result that a reliable determination of the torque is no longer possible.

In addition, the problem is solved by a corresponding method and use of the device.

According to a further embodiment of the device, the at least two magnetic field sensors are arranged in relation to the component in a non-contacting manner, thereby enabling the measurement of mechanical influences on the component, with the component itself being mechanically uninfluenced by the magnetic field sensor. Thus, the sensor does not contact the component. As a result, the accuracy of measurement is increased. In this way, freedom from wear and friction are also ensured.

A further embodiment of the invention provides that the at least two sensors are magnetic field sensors based on a fluxgate. The fluxgate sensor is a highly sensitive measuring device for detecting extremely small magnetic fields.

For example, Hall sensors can also be used as magnetic field sensors.

It must, however, be pointed out that any suitable type of magnetic field sensor may be used according to the invention.

According to a preferred embodiment of the invention, in addition to the two aforementioned sensors, further coils for the same sensors can be arranged at another position of the circumferential surface of the component casing. Preferably, they are offset by 180 degrees. In this way, it is possible to take sensor measurements at different positions of the circumferential surface of the component casing of a track and thus determine an average value providing higher accuracy.

As a result, additional measurement values are obtained which are capable of compensating a decreasing influence of the magnetic strength on the sensor in particular due to a radial distance of the component from the above-described coils of the magnetic field sensor, resulting, for example, from its rotatory movement or from fabrication tolerances.

Additional coils of the respective sensors can be arranged in the region of the circumferential surface of the component casing in such a manner that reliable measurements are possible even in the case of transverse movements of the component in its radial plane and influences of the magnetic strength associated therewith. Accordingly, they may be arranged at any position in the region of the circumferential surface of the component casing over a circumference of 360 degrees.

In this respect, it is noted that it is particularly advantageous if preferably two coils of different sensors are spaced 90 degrees apart from the next, preferably two, coils of different sensors in each case. This results in an arrangement of four pairs of coils arranged at a distance of 90 degrees over a circumference of 360 degrees, which are each assigned to different sensors.

In this connection, coils cannot only be used for the same but also for further sensors, which is within the discretion of the person skilled in the art, in particular with regard to the electronics applied.

While the above-described embodiment of the invention includes two dual-band sensors relating to three magnetic tracks, a further embodiment of the invention relates to an expansion of the three-track magnetic field by at least one further track, i.e. a fourth track. In this further embodiment, two sensors relating to the tri-band magnetisation are used, which relate to a total of four magnetic tracks. In this case, the first three tracks of the quad-band magnetisation are to be considered as a first group to which the first sensor relates. The second sensor is assigned to the last three tracks of the quad-band magnetisation displaced by one magnetic track.

This so-called quad-band magnetisation thus has a first outer magnetic track, two middle magnetic tracks as well as a second outer magnetic track. As a result, two middle tracks are detected by both sensors in an overlapping manner.

Irrespective of this special feature, reference can be made to all of the above explanations in connection said quad-band magnetisation, with the explanations also applying to this arrangement. In particular, these magnetic tracks are likewise alternately magnetised in the opposite direction.

Yet another embodiment of the invention is characterised by the arrangement of the magnetic tracks on a component of varying diameter. With respect to this arrangement, it has been shown that the evaluation results are even clearer.

On the one hand, this embodiment can be configured in such a way that the tri-band magnetisation is located, for example, on the component with a smaller diameter, whereas an additional dual-band magnetisation is arranged on the component with a larger diameter. A reverse configuration is, of course, also possible. Preferably, the tri-band magnetisation is measured by means of two dual-band sensors in the same way as described with respect to the first embodiment. On the component having a larger diameter, a usual dual-band magnetisation, a tri-band magnetisation or a quad-band magnetisation can be arranged, which may also apply vice versa to the component with a smaller diameter.

By using two different diameters, the output signals can be compared, and an external influence is more apparent than in an embodiment in which the component has a uniform diameter. The comparison of the signals puts more emphasis on the external influence.

In addition, such an assembly allows for a comparison of the hysteresis, because, due hysteresis, one sensor shows a significantly different behaviour compared to the other one.

The output signal on the smaller diameter reveals a greater signal deviation due to hysteresis, but has less rotational deformations. The magnetic field around the shaft is not a perfect circle. In addition to the compensation of radial movements, the use of a plurality of coils for each track is also advantageous in this respect.

Further aspects and features of the invention result from the following description of preferred embodiments of the invention according to FIGS. 1 to 3.

Figure 1:
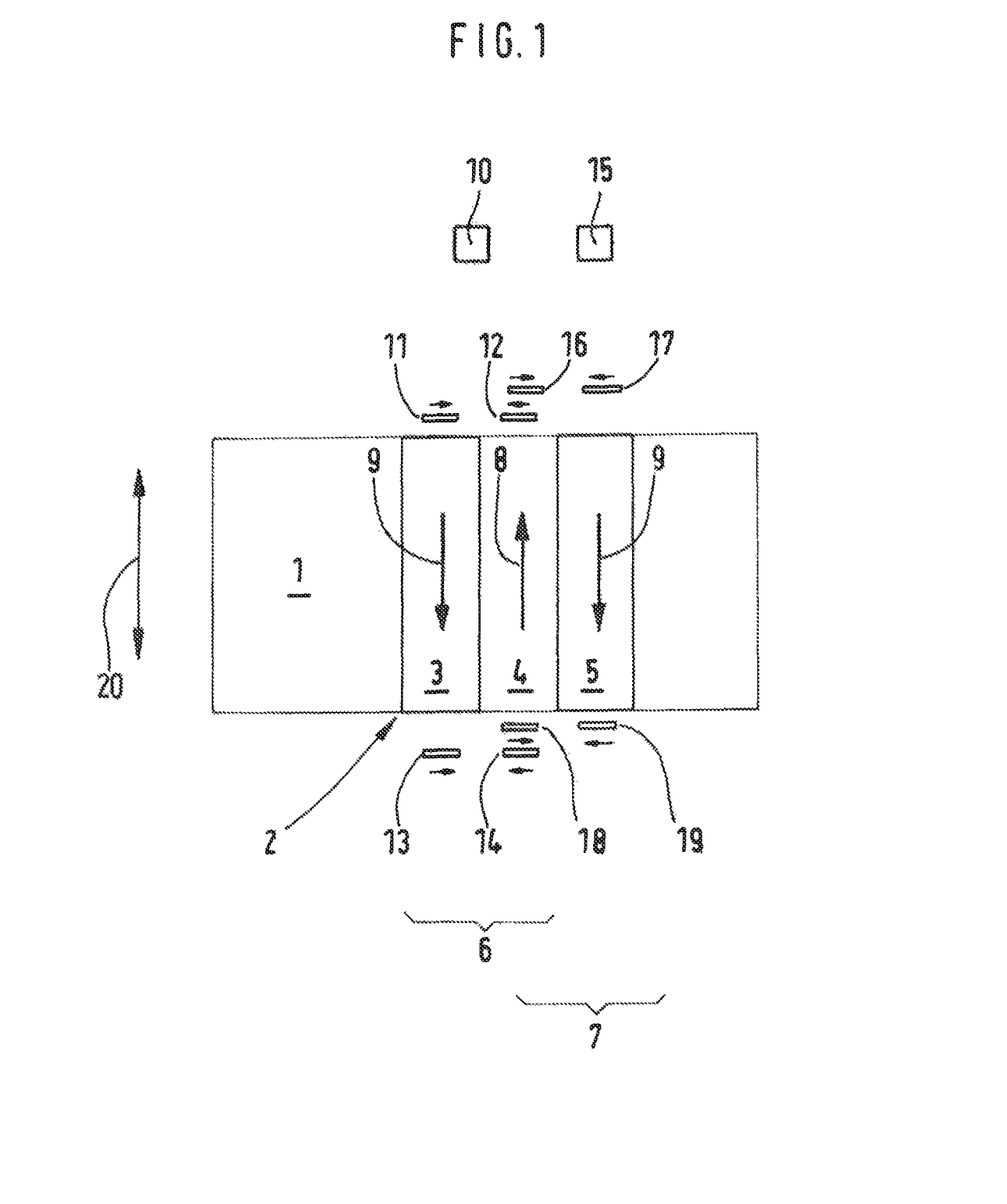
FIG. 1 shows a schematic view of a component, in particular a shaft, having three magnetic tracks surrounding the shaft.

FIG. 1 shows a component 1 with a magnetised region 2. The magnetised region 2 comprises three magnetic tracks 3, 4, 5. The magnetic tracks 3, 4, 5 adjacent to each other each have an opposing circumferential magnetisation 8, 9. The magnetic track 3 and the magnetic track 5 have a circumferential magnetisation 9. The common magnetic track 4 has a magnetisation 8 opposing 9.

The magnetised region 2 is subdivided into two groups 6, 7.

The magnetic tracks 3 and 4 are assigned to the first group 6 of the magnetised region 2.

The magnetic tracks 4 and 5 are assigned to the second group 7 of the magnetised region 2. Both groups 6, 7 of the magnetic tracks 3, 4, 5 have the magnetic track 4 in common.

A first sensor 10 is assigned to the magnetic tracks 3 and 4. The first sensor 10 comprises the coils 11, 12 as well as the coils 13, 14 if there should be the possibility to detect a movement of the component 1 in the radial direction. In this way, the distance change is compensated. In other words, the integral of the distances of the coils from the surface of the component, in particular the surface of the shaft, is kept constant.

The second sensor 15 of the second group 7 comprises at least the coils 16, 17, whereas the coils 18, 19 are required for compensating radial movements and serve the purpose of correcting rotation-dependent errors.

The sensors 10 and 15 are arranged in such a manner that the component 1, preferably the shaft, extends between the coils 11 and 13, 12 and 14, 16 and 18, 17 and 19, respectively.

The arrangement of the component 1 between the coils 11, 12, 16, 17 and the coils 13, 14, 18, 19 allows the component 1 to move away from the coils 11, 12, 16, 17 and, at the same time, to approach the coils 13, 14, 18, 19, and vice versa, when performing a radial movement 20 between the coils 11, 12, 16, 17 and 13, 14, 18, 19.

Independent of the radial movement 20 of the component 1, the magnetic tracks 3, 4, 5 thus always remain within the effective range of either the coils 11, 12, 16, 17 or the coils 13, 14, 18, 19 of the associated sensors 10 and 15, respectively. Hence, the functional capability of the sensors 10 and 15 is maintained independent of the radial movement 20 of the component 1 within the coils 11, 12, 16, 17 and 13, 14, 18, 19.

Since the magnetic track 4 is assigned both to the first group of magnetic tracks 6 and the second group of magnetic tracks 7, the two coils 12 and 14 of the first sensor 10 and the two coils 16 and 18 of the sensor 15 are assigned to the magnetic track 4.

FIG. 1 shows a view in which the coils 12, 16 on the one hand and the coils 14, 18 on the other are arranged vertically, that is to say above and below each other. In the axial direction, these middle coils are located in exactly the same place, but they are arranged in a rotatory manner according to the installation space required. The distance from the component, in particular from the surface of the shaft, is identical.

In FIG. 1, the sensor 15 has the function of redundant sensor.

Figure 2:
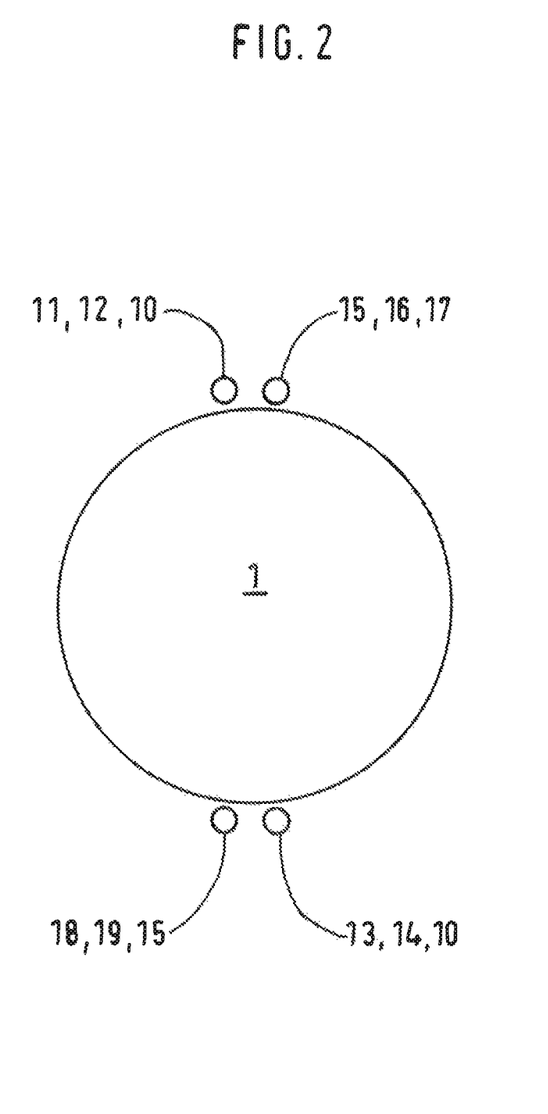
FIG. 2 shows the cross section of the component, in particular the shaft, with magnetic field sensors arranged on the respective upper side and bottom side of the shaft.

FIG. 2 shows a cross section of the component 1 with the sensor 10 including its coils 11 and 12 arranged at the top as well as the second sensor 15 including the coils 16, 17, which is likewise arranged at the top.

The second sensor 15 with separate coils 18 and 19 can be arranged offset relative to the component 1 on the bottom side thereof. Opposite the second sensor 15, the first sensor 10 with the coils 13 and 14 is shown, which is likewise arranged on the bottom side of the component 1.

In FIG. 2, the constructional displacement of the sensors is shown in such a way that the coils 11, 12 of the first sensor 10 on the upper side of the component 1 are arranged diagonally opposite the coils 13 and 14 of the first sensor 10 on the bottom side of the component 1.

On the upper side of the component 1, the coils 16, 17 of the second sensor 15 are arranged in the same manner at an angle of 180 degrees opposite the coils 18, 19 of the second sensor 15 on the bottom side of the component.

Figure 3:
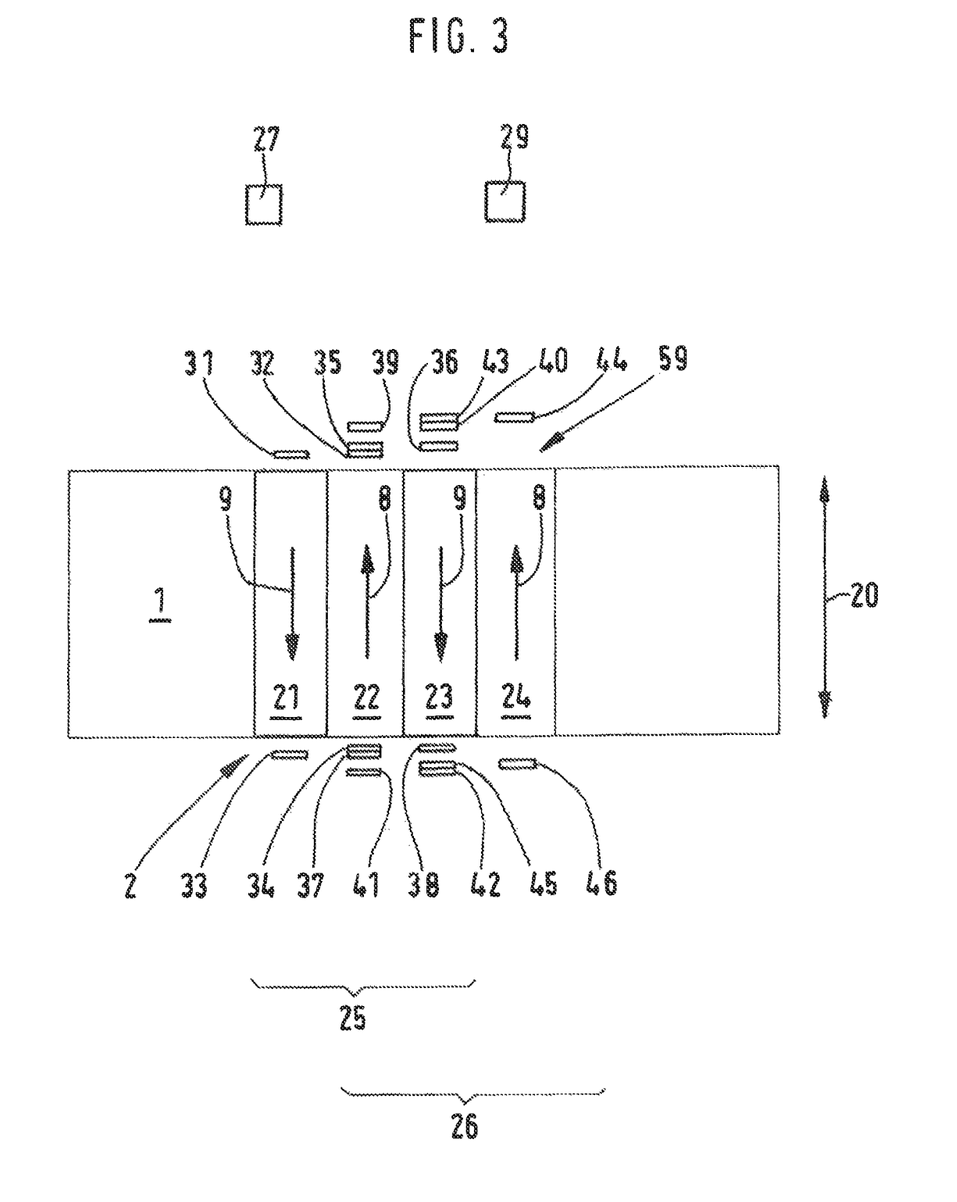
FIG. 3 shows a view comparable to FIG. 1, with the difference that four magnetic tracks are provided.

FIG. 3 show a component 1, in particular a shaft, with a magnetised region 2 comprising magnetic tracks 21, 22, 23, 24. Thus, the so-called quad-band magnetisation 59 shown in FIG. 3 has a first outer magnetic track 21, two middle magnetic tracks 22, 23 as well as a second outer magnetic track 24.

The magnetic tracks 21, 22, 23, 24 arranged adjacent to each other have an opposing circumferential magnetisation 8, 9.

The magnetised region 2 of the component 1 is subdivided into a group 25 of magnetic tracks 21, 22, 23 and a group 26 of magnetic tracks 22, 23, 24.

The magnetic tracks 22 and 23 are common magnetic tracks of the group 25 and the group 26. In the arrangement of the two groups 25 and 26 on the component 1, the common magnetic tracks 22 and 23 of the group 25 overlap the group 26, and vice versa.

In FIG. 3, a sensor 27 is assigned to the first group 25 of the magnetic tracks 21, 22, 23.

A sensor 29 is assigned to the second group 26 of the magnetic tracks 22, 23, 24 in FIG. 3.

The sensor 27 of the first group 25 comprises the coils 31, 32, 33, 34, 35, 36, 37, 38. The coils 33, 34, 37, 38 serve the purpose of detecting radial movements and a so-called rotational signal uniformity.

The sensor 29 of the second group 26 of the magnetic tracks 22, 23, 24 comprises the coils 39, 40, 41, 42, 43, 44, 45, 46. The coils 41, 42, 45, 46 serve the purpose of detecting radial movements and a so-called rotational signal uniformity.

Here, the coils 39, 40, 43 and 44 are arranged relative to the component 1 on the upper side thereof and the coils 41, 42, 45 and 46 on the opposite bottom side.

In the event that the component 1, preferably a shaft, moves in the radial direction 20 between the coils 31, 32, 35, 39, 36, 40, 43, 44 on the one hand and the coils 33, 34, 37, 41, 38, 42, 45, 46 on the other, with increasing distance from the coils 31, 32, 35, 36, 39, 40, 43, 44, the magnetic tracks 21, 22, 23, 24 reach the effective range of the coils 33, 34, 37, 38, 41, 42, 45, 46, and vice versa.

Figure 4:
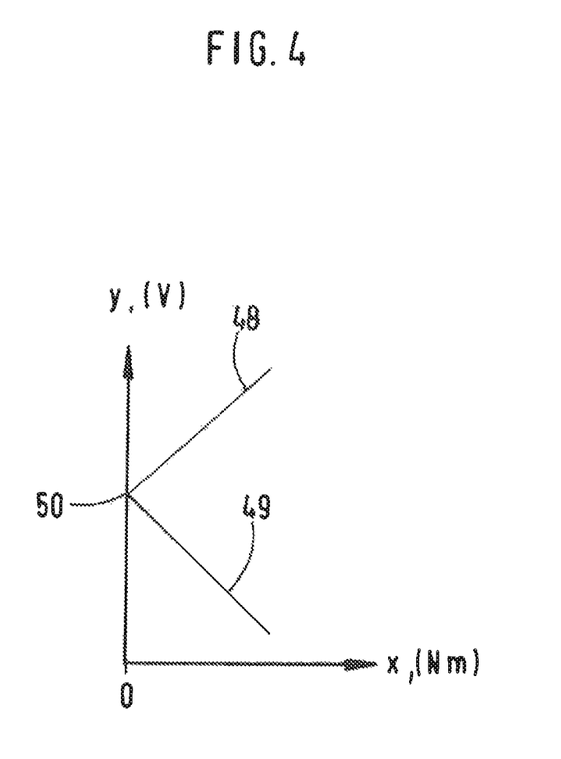
FIG. 4 shows a coordinate system with a first curve assigned to a first sensor and a second curve assigned to a second sensor.

FIG. 4 shows a quadrant of a Cartesian coordinate system with an x-axis on which the torque values are plotted in Nm. On the corresponding y-axis, however, voltage values are plotted in volt (V).

A curve 48 and a curve 49 are plotted in the coordinate system.

Both curves 48, 49 relate to a magnetic field 2 of a component 1 with three magnetic tracks 3,4,5 corresponding to the illustration in FIG. 1.

The curve 48 is assigned to the sensor 10, 27 and the curve 49 to the sensor 15, 29.

Both curves 48 and 49 have their starting points at 0 Nm on the x-axis and at a value V indicated by reference numeral 50 on the y-axis.

As a result of the magnetisation 9, 8 of the magnetic tracks 3, 4 of the first group 6, with increasing Nm values on the x-axis, the curve 48 shows increasing V values on the y-axis.

Due to the reversal of magnetisation 8, 9 of the magnetic tracks 4, 5 of the second group 7 of the magnetised region 2, with increasing Nm values on the x-axis of the coordinate system, the curve 49 shows decreasing V values on the y-axis.

Figure 5:
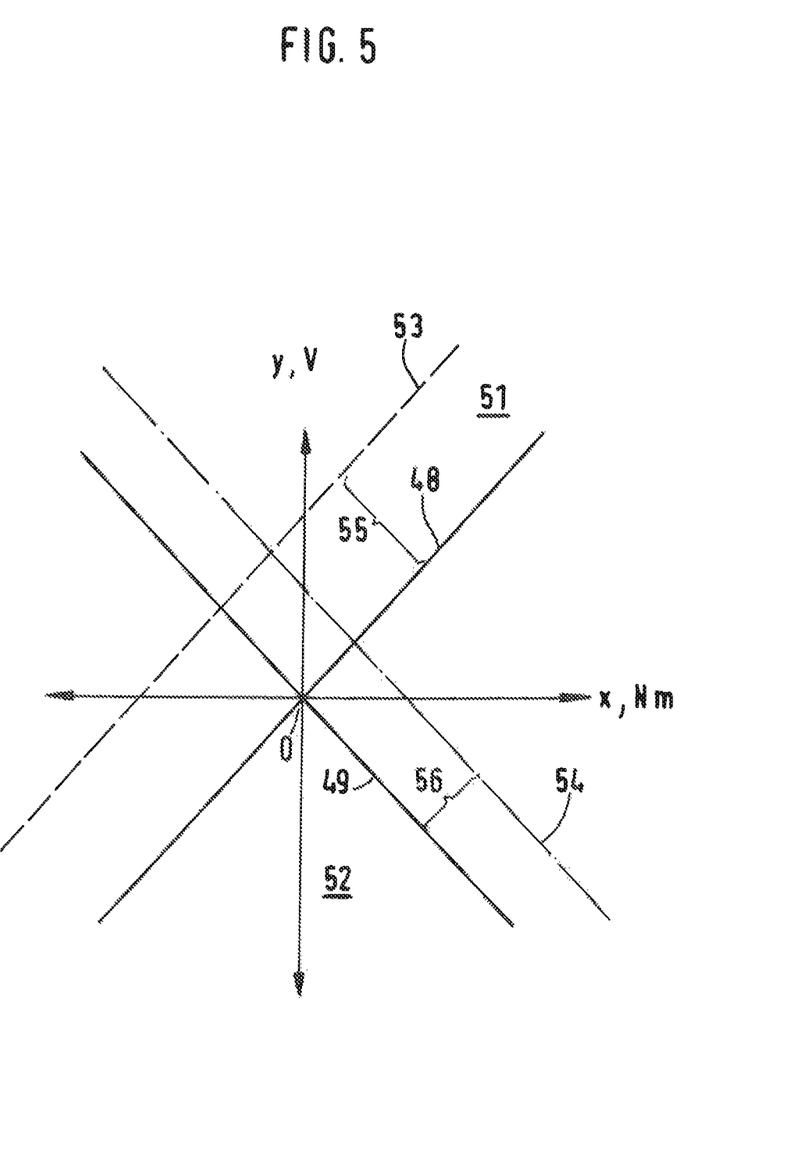
FIG. 5 shows a coordinate system with a curve assigned to a first sensor and a second curve assigned to a second sensor, with an external magnetic field acting on the curves.

FIG. 5 shows a Cartesian coordinate system with a first quadrant 51 and a second quadrant 52.

In accordance with FIG. 4, a curve 48 assigned to the sensor 10 and a curve 49 assigned to the sensor 15 are plotted in FIG. 5.

Contrary to the illustration in FIG. 4, the two curves 48 and 49 each have their starting points at 0 Nm on the x-axis and at 0 V on the y-axis.

The further course of the curves 48 and 49 corresponds to the respective description of both curves in FIG. 4.

Due to an external magnetic field, the magnetisation 8, 9 of the magnetic tracks 3, 4, 5 is influenced in such a way that a unidirectional parallel shift of the curves 48 and 49 takes place.

Due to the parallel shift, a curve 53 is assigned to the curve 48, and a parallel curve 54 is assigned to the curve 49.

In addition, it can be seen from FIG. 5 that the parallel shifts of the curve 48 of the sensor 10 and the curve 49 of the sensor 15 take place to a different extent.

The curve 48 of the sensor 10 is shifted by a distance 55, whereas the curve 49 of the sensor 15 is shifted parallel by a smaller distance 56, which means that the two sensors are exposed to different external magnetic influences.

Figure 6:
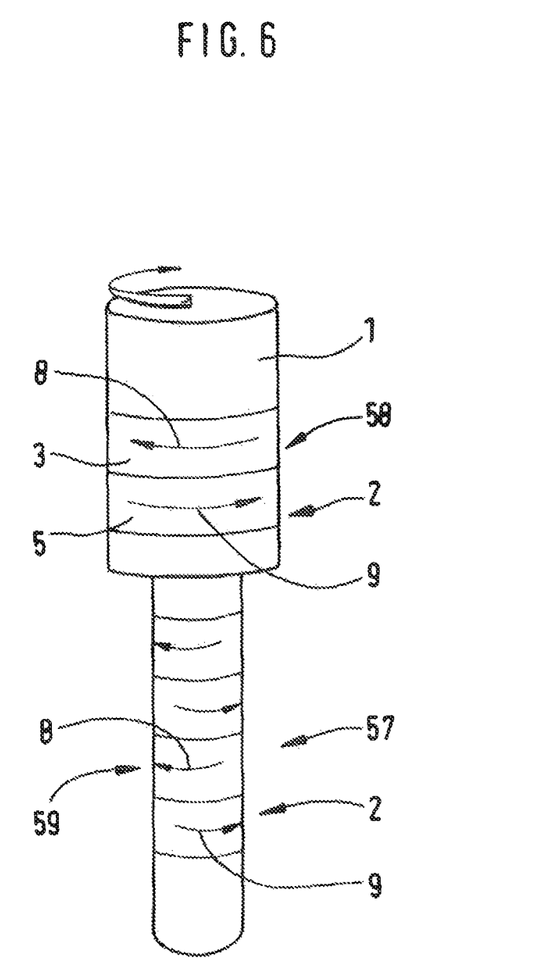
FIG. 6 shows a component with the arrangement of magnetic fields in regions of different diameters.

FIG. 6 shows a component 1 having a region 57 with a smaller diameter and a region 58 with a larger diameter. A magnetised region 2 with a quad-band magnetisation 59 is shown in the region 57. In the region 58, however, a magnetised region 2 is shown which comprises two magnetic tracks 3, 5. The adjacent magnetic tracks have magnetisations 8 and 9 opposing each other.

REFERENCE NUMERALS 1 component
2 magnetised region
3 magnetic track
4 common magnetic track
5 magnetic track
6 group
7 group
8 magnetisation
9 magnetisation
10 first sensor; first group
11 coil
12 coil
13 coil
14 coil
15 second sensor; second group
16 coil
17 coil
18 coil
19 coil
20 radial movement
21 magnetic track
22 magnetic track
23 magnetic track
24 magnetic track
25 group
26 group
27 sensor; first group
28 left blank
29 sensor; second group
30 left blank
31 coil
32 coil
33 coil
34 coil
35 coil
36 coil
37 coil
38 coil
39 coil
40 coil
41 coil
42 coil
43 coil
44 coil
45 coil
46 coil
47 value at 0 Nm
48 curve; sensor 10
49 curve; sensor 15
50 V value; y-axis
51 first quadrant
52 second quadrant
53 parallel curve; sensor 10
54 parallel curve; sensor 15
55 distance; curve sensor 10
56 distance; curve sensor 15
57 region
58 region
59 quad-band magnetisation

What is claimed is:

1. A device for determining an external magnetic influence comprising:
a component comprised of a ferromagnetic material and having a center axis, the component having a magnetizable region comprising at least three magnetic tracks with adjacent magnetic tracks being magnetized in opposite directions of each other, the at least three magnetic tracks being arranged circumferentially and perpendicular to the component center axis;
at least two coils of a first magnetic field sensor for emitting a signal, the first magnetic field sensor coils being arranged axially in relation to the component and radially spaced from the component, and being assignable to the first outer and at least one middle magnetic track, respectively;
at least two coils of a second magnetic field sensor for emitting a signal, the second magnetic field sensor coils being arranged axially in relation to the component and radially spaced from the component, and being assignable to the at least one middle and second outer magnetic track, respectively; and
wherein the signal of the first sensor is configured to be set in relation to the signal of the second sensor.

2. A device according to claim 1, characterised in that one of the two sensors is configured in the form of a redundant sensor.

3. A device according to claim 1, characterised in that the component is a shaft.

4. A device according claim 1 further comprising at least two further coils arranged axially in relation to the component and radially spaced from the component, and being assignable to the first and middle magnetic track, respectively, and at least two further coils arranged axially in relation to the component and radially spaced from the component, and being assignable to the middle and third magnetic track, respectively.

5. A device according to claim 1, characterised in that at least one of the first and second magnetic field sensor are arranged in relation to the component in a non-contacting manner.

6. A device according to claim 1, characterised in that at least one of the first and second magnetic field sensor comprise a fluxgate.

7. A device according to claim 1, characterised in that the component is configured to be subject to a torque about its center axis.

8. A device according to claim 1, characterised in that the diameter of the component in a region adjacent to the at least first sensor differs from the diameter of the component in a region adjacent to the further sensor.

9. A method for determining an external magnetic influence comprising:
   providing a component comprised of a ferromagnetic material and having a center axis;
   magnetizing the component in a manner to generate at least three opposing magnetic tracks of a magnetizable region wherein the adjacent magnetic tracks are magnetizable in opposite directions from each other, and at least two groups of adjacent magnetic tracks are arranged in an overlapping manner and axially displaced on the component relative to the center axis;
   arranging a first magnetic field sensor radially spaced from the component in a manner such that the first magnetic field sensor is assigned to the first and middle magnetic track, respectively, wherein the first magnetic field sensor is configured for emitting a signal;
   arranging a second magnetic field sensor radially spaced from the component in a manner such that the second magnetic field sensor is assigned to the middle and third magnetic track, wherein the second magnetic field sensor is configured for emitting a signal; and
   setting of the signal of the first sensor in relation to the signal of the second sensor.

10. A device for determining an external magnetic influence, comprising:
   a component having a center axis and comprising a ferromagnetic material, the component having a magnetizable region comprising at least three opposing magnetic tracks, wherein the adjacent magnetic tracks are magnetizable in opposite directions from each other, and at least two groups of adjacent magnetic tracks are arranged in an overlapping manner and axially displaced on the component;
   a first magnetic field sensor having at least two coils for emitting a signal, the first magnetic field sensor coils being arranged axially in relation to the component and being radially spaced from the component, the first magnetic field sensor coils being assignable to the first and middle magnetic track;
   a second magnetic field sensor with at least two coils for emitting a signal, the second magnetic field sensor coils being arranged axially in relation to the component and being radially spaced from the component, the second magnetic field sensor coils being assignable to the middle and third magnetic track; and
   wherein the signal of the first sensor is configured to be set in relation to the signal of the second sensor.

* * * * *